(12) United States Patent
Liu (10) Patent No.: US 10,665,721 B1
(45) Date of Patent: May 26, 2020

(54) MANUFACTURING METHOD OF FLEXIBLE TFT BACKPLANE AND FLEXIBLE TFT BACKPLANE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Fangmei Liu, Guangdong (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 116 days.

(21) Appl. No.: 16/090,191

(22) PCT Filed: Sep. 7, 2018

(86) PCT No.: PCT/CN2018/104485
§ 371 (c)(1),
(2) Date: Sep. 28, 2018

(87) PCT Pub. No.: WO2019/184254
PCT Pub. Date: Oct. 3, 2019

(30) Foreign Application Priority Data

Mar. 29, 2018 (CN) .......................... 2018 1 0274328

(51) Int. Cl.
*H01L 29/786* (2006.01)
*H01L 27/32* (2006.01)
(Continued)

(52) U.S. Cl.
CPC .... *H01L 29/78603* (2013.01); *H01L 27/3258* (2013.01); *H01L 29/66969* (2013.01);
(Continued)

(58) Field of Classification Search
CPC ......... H01L 29/78603; H01L 29/66969; H01L 29/7869; H01L 27/3258; H01L 51/0048; H01L 51/0097
See application file for complete search history.

(56) References Cited

U.S. PATENT DOCUMENTS

| 10,418,490 | B2 * | 9/2019 | Xie | .................... H01L 29/66742 |
| 2018/0337358 | A1 * | 11/2018 | Xie | ..................... H01L 51/0566 |

FOREIGN PATENT DOCUMENTS

| CN | 102842602 A | 12/2012 |
| CN | 104051652 A | 9/2014 |
(Continued)

*Primary Examiner* — Earl N Taylor
(74) *Attorney, Agent, or Firm* — Leong C. Lei (57) ABSTRACT

The invention provides a manufacturing method of flexible TFT backplane. The method uses a mixed solution of carbon nanotubes and metal oxide to prepare active layer (61) of TFT (T), and the temperature is lower and will not cause damage to the flexible base substrate (2), and the material of flexible base substrate (2) is not restricted. The use of vacuum equipment is reduced to save production cost. The carbon nanotubes have excellent conductivity, and the mixture with metal oxide as the active layer (61) of the TFT can improve the electron mobility. The buffer layer (3) has a silicon nitride film (31) as the lowest layer contacting the flexible base substrate (2), making good adhesion between buffer layer (3) and flexible base substrate (2). The topmost layer of the buffer layer (3) is an aluminum oxide film (33), which enables the buffer layer (3) to resist to water.

14 Claims, 6 Drawing Sheets

(51) Int. Cl.
*H01L 51/00* (2006.01)
*H01L 29/66* (2006.01)

(52) U.S. Cl.
CPC ...... *H01L 29/7869* (2013.01); *H01L 51/0048* (2013.01); *H01L 51/0097* (2013.01)

(56) References Cited

FOREIGN PATENT DOCUMENTS

| | | |
|---|---|---|
| CN | 108428666 A | 8/2018 |
| KR | 10-2015-0063177 A | 6/2015 |

\* cited by examiner

MANUFACTURING METHOD OF FLEXIBLE TFT BACKPLANE AND FLEXIBLE TFT BACKPLANE

RELATED APPLICATIONS

The present application is a National Phase of International Application Number PCT/CN2018/104485, filed Sep. 7, 2018, and claims the priority of China Application No. 201810274328.0, filed Mar. 29, 2018.

BACKGROUND OF THE INVENTION

1. Field of the Invention

The present invention relates to the field of display techniques, and in particular to a manufacturing method of flexible thin film transistor (TFT) backplane and TFT backplane.

2. The Related Arts

In the field of display technology, the flat panel display technologies, such as liquid crystal display (LCD) and organic light-emitting diode (OLED), have replaced CRT displays. The OLED displays provide many advantages, such as self-luminescence, low driving voltage, high luminous efficiency, short response time, high definition and contrast ratio, a viewing angle of nearly 180°, a wide range of operating temperatures; ability to realize flexible display and large-area full-color display, and are recognized by the industry as the most promising display device.

A known flexible OLED display generally comprises a flexible thin film transistor (TFT) array substrate backplane and OLED elements provided on the flexible TFT backplane. The flexible TFT backplane is used to drive the OLED element; the OLED element comprises an anode, a hole injection layer disposed on the anode, a hole transport layer disposed on the hole injection layer; a light-emitting layer disposed on the hole transport layer, an electron transport layer disposed on the light-emitting layer, an electron injection layer disposed on the electron transport layer, and the cathode disposed on the electron injection layer. The light-emitting mechanism of the OLED element is that the semiconductor material and the organic light-emitting material; under driven by an electric field, emit light through the carrier injection and compounding. Electrons and holes are injected respectively from the cathode and the anode into the electron injection layer and the hole injection layer under a certain voltage. Electrons and holes migrate through the electron transport layer and the hole transport layer respectively to the light-emitting layer, and meet in the light-emitting layer to form excitons and excite the light-emitting molecules, which emit visible light through radiation relaxation.

In the current technology, the base substrate used in the manufacturing method of the flexible TFT backplane can generally only tolerate low temperatures. The conventional methods for manufacturing TFTs on flexible base substrates must be limited by temperature to prevent damage to the flexible base substrate.

In addition, the TFT array substrate has a lower electron mobility by the conventional manufacturing method on the flexible base substrate.

SUMMARY OF THE INVENTION

The object of the present invention is to provide a manufacturing method of TFT backplane, able to be manufactured at a lower temperature and without limitation on the material of flexible base substrate, as well as, improving the electron mobility of the active layer of the TFT.

Another object of the present invention is to provide a flexible TFT backplane, with high electron mobility of the active layer of the TFT, good strength and flexibility.

To achieve the above object; the present invention provides a manufacturing method of TFT backplane, which comprises the steps of:

Step S1: providing a glass substrate, cleaning and pre-baking the glass substrate;

Step S2; coating a flexible base substrate on the glass substrate;

Step S3: repeatedly depositing a silicon nitride film and a silicon oxide film stacked on the silicon nitride film on the flexible base substrate, and then depositing an aluminum oxide film to form a buffer layer;

Step S4: depositing a first metal film on the buffer layer and patterning the first metal film to form a gate;

Step S5: depositing a gate insulating layer on the gate and buffer layer;

Step S6: preparing a mixed solution of carbon nanotubes and metal oxide, then coating the mixed solution of carbon nanotubes and metal oxide on the gate insulating layer, and drying to obtain a film of mixed carbon nanotubes and metal oxide;

Step S7: patterning the film of mixed carbon nanotubes and metal oxide to form an active layer above the gate;

Step S8: depositing an interlayer insulating layer on the active layer and the gate insulating layer, patterning the interlayer insulating layer to form a first via hole and a second via hole penetrating the interlayer insulating layer, the first via hole and the second via hole respectively exposing two ends of the active layer;

Step S9: depositing a second metal film on the interlayer insulating layer, patterning the second metal film to form a source and a drain, the source and the drain contacting the two ends of the active layer respectively through the first via hole and the second via hole;

the gate, the active layer, the source and the drain forming a TFT.

According to a preferred embodiment of the present invention, the manufacturing method further comprises:

Step S10: depositing a passivation layer on the interlayer insulating layer, the source and the drain, patterning the passivation layer to form a third via hole penetrating the passivation layer, the third via hole exposing the drain;

Step S11: removing the glass substrate.

According to a preferred embodiment of the present invention, the flexible base substrate is a yellow polyimide film or a transparent polyimide film.

According to a preferred embodiment of the present invention, in step S3, the process of depositing a silicon nitride film and a silicon oxide film stacked on the silicon nitride film is repeated 2-3 times, and total thickness of the silicon nitride film and the silicon oxide film is 5000-20000 Å.

According to a preferred embodiment of the present invention, in step S3, the aluminum oxide film is deposited by an atomic layer deposition process, and the aluminum oxide film has a thickness of 200-1000 Å.

According to a preferred embodiment of the present invention, the metal oxide is zinc oxide; when the mixed solution of carbon nanotubes and zinc oxide is prepared in step S6, the weight ratio of carbon nanotubes to zinc oxide is 5:100-20:100.

According to a preferred embodiment of the present invention, polyethylene glycol is used as a solvent when the mixed solution of carbon nanotubes and zinc oxide is prepared in step S6.

According to a preferred embodiment of the present invention, the gate insulating layer is made of silicon oxide and the thickness is 1000-5000 Å; the interlayer insulating layer is made of silicon oxide and the thickness is 1000-3000 Å, and the passivation layer is made of silicon oxide or silicon nitride and the thickness is 1000-5000 Å;

the first metal film and the second metal film are made of a laminated combination of one or more of molybdenum, aluminum, copper, and titanium, and the thickness is 2000-8000 Å.

The present invention also provides a flexible TFT backplane, which comprises:

a flexible base substrate;

a buffer layer covering the flexible base substrate, the buffer layer comprising: a plurality of layers of silicon nitride films and silicon oxide films, stacked alternatingly from the bottom to the top, with an aluminum oxide film located as a top layer;

a gate, disposed on the buffer layer;

a gate insulating layer, covering the gate and the buffer layer;

an active layer, disposed above the gate and the gate insulating layer; the active layer being made of a mixed film of carbon nanotubes and zinc oxide;

an interlayer insulating layer covering the active layer and the gate insulating layer; the interlayer insulating layer being disposed with a first via hole and a second via hole, the first via hole and the second via hole respectively exposing two ends of the active layer;

a source and a drain, disposed on the interlayer insulating layer, the source and the drain contacting the two ends of the active layer respectively through the first via hole and the second via hole;

the gate, the active layer, the source and the drain forming a TFT.

According to a preferred embodiment of the present invention, the flexible TFT backplane further comprises a passivation layer covering the interlayer insulating layer; the source and the drain, the passivation layer is disposed with a third via hole, and the third via hole exposes the drain.

The present invention also provides a manufacturing method of TFT backplane, which comprises the steps of:

Step S1; providing a glass substrate, cleaning and prebaking the glass substrate;

Step S2: coating a flexible base substrate on the glass substrate;

Step S3: repeatedly depositing a silicon nitride film and a silicon oxide film stacked on the silicon nitride film on the flexible base substrate, and then depositing an aluminum oxide film to form a buffer layer;

Step S4: depositing a first metal film on the buffer layer and patterning the first metal film to form a gate;

Step S5: depositing a gate insulating layer on the gate and buffer layer;

Step S6: preparing a mixed solution of carbon nanotubes and metal oxide, then coating the mixed solution of carbon nanotubes and metal oxide on the gate insulating layer, and drying to obtain a film of mixed carbon nanotubes and metal oxide;

Step S7: patterning the film of mixed carbon nanotubes and metal oxide to form an active layer above the gate;

Step S8: depositing an interlayer insulating layer on the active layer and the gate insulating layer, patterning the interlayer insulating layer to form a first via hole and a second via hole penetrating the interlayer insulating layer, the first via hole and the second via hole respectively exposing two ends of the active layer;

Step S9: depositing a second metal film on the interlayer insulating layer; patterning the second metal film to form a source and a drain, the source and the drain contacting the two ends of the active layer respectively through the first via hole and the second via hole;

the gate, the active layer, the source and the drain forming a TFT;

Step S10: depositing a passivation layer on the interlayer insulating layer, the source and the drain, patterning the passivation layer to form a third via hole penetrating the passivation layer, the third via hole exposing the drain;

Step S11: removing the glass substrate;

wherein the flexible base substrate being a yellow polyimide film or a transparent polyimide film;

wherein in step S3, the process of depositing a silicon nitride film and a silicon oxide film stacked on the silicon nitride film being repeated 2-3 times, and total thickness of the silicon nitride film and the silicon oxide film being 5000-20000 Å;

wherein in step S3, the aluminum oxide film being deposited by an atomic layer deposition process, and the aluminum oxide film having a thickness of 200-1000 Å.

The present invention provides the following advantages: the manufacturing method of flexible TFT backplane provided by the present invention uses a mixed solution of carbon nanotubes and a metal oxide to prepare an active layer of a TFT, and the temperature of the manufacturing is lower and will not cause damage to the flexible base substrate, and hence the material of the flexible base substrate is not restricted. The use of the vacuum equipment can be reduced to save production cost. The carbon nanotubes have excellent conductivity, and the mixture with the metal oxide as the active layer of the TFT can significantly improve the electron mobility. In addition, buffer layer made by the manufacturing method has a silicon nitride film as the lowest layer in contact with the flexible base substrate, which can make the good adhesion between the buffer layer and the flexible base substrate. The topmost layer of the buffer layer is an aluminum oxide film, which enables the buffer layer to have better resistance to water and vapor. The flexible TFT backplane provided by the present invention uses a mixed film of carbon nanotubes and metal oxides as an active layer of the TFT, which can significantly improve the electron mobility. The carbon nanotubes improve the strength and the flexibility of the active layer of the TFT and more suitable for fabricating a flexible display device. In addition, the buffer layer has a silicon nitride film as the lowest layer in contact with the flexible base substrate, which can make the good adhesion between the buffer layer and the flexible base substrate. The topmost layer of the buffer layer is an aluminum oxide film, which enables the buffer layer to have better resistance to water and vapor.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further illustrate the technical means taken by the present invention and resulted effects, the following detailed description is made in conjunction with the preferred embodiments of the present invention and the accompanying drawings.

Figure 1:
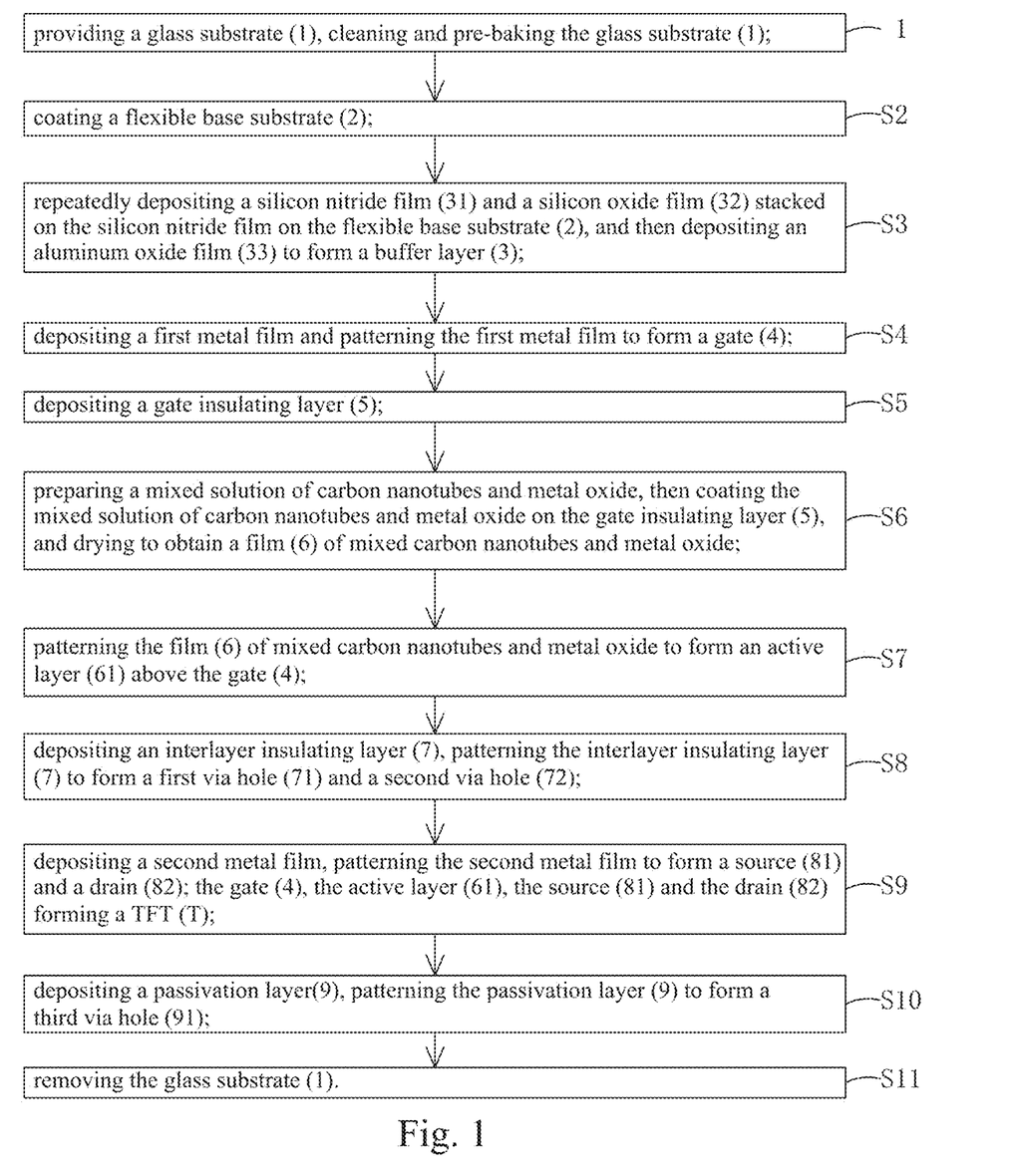
FIG. 1 is a schematic view showing the flowchart of the manufacturing method of flexible TFT backplane provided by an embodiment of the present invention.
Figure 2:
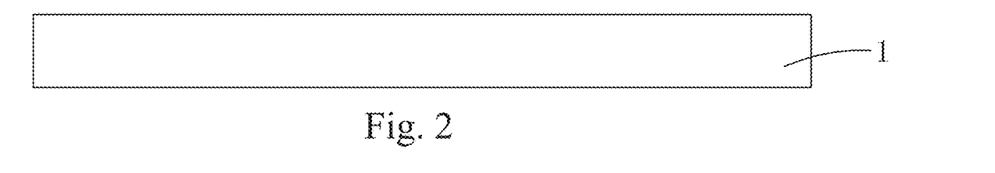
FIG. 2 is a schematic view showing step S1 of the manufacturing method of flexible TFT backplane provided by the embodiment of the present invention.

Referring to FIG. 1, the present invention provides a manufacturing method of flexible TFT backplane, comprising the steps of:

Step S1: as shown in FIG. 2, providing a glass substrate 1, cleaning and pre-baking the glass substrate 1.

Figure 3:
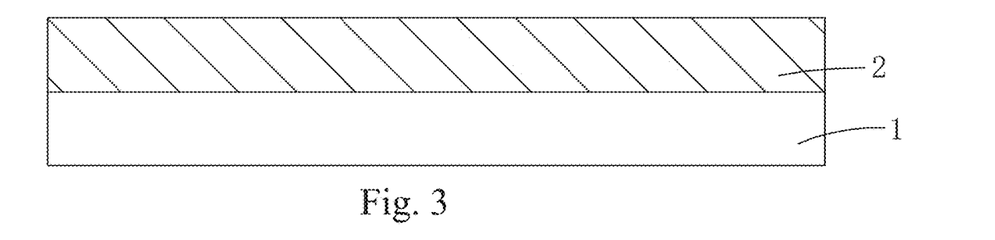
FIG. 3 is a schematic view showing step S2 of the manufacturing method of flexible TFT backplane provided by the embodiment of the present invention.

Step S2: as shown in FIG. 3, coating a flexible base substrate 2 on the glass substrate 1.

Specifically, the flexible base substrate 2 is a yellow polyimide (PI) film or a transparent PI film. The yellow PI film can tolerate a higher temperature than the transparent PI film.

Figure 4:
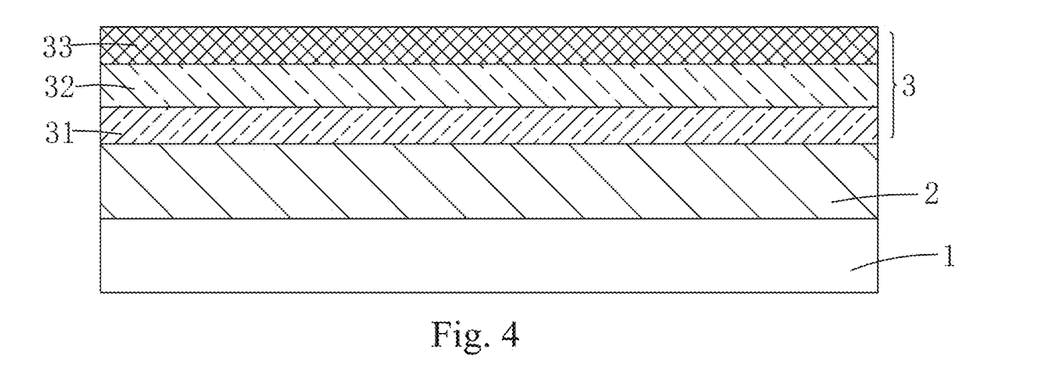
FIG. 4 is a schematic view showing step S3 of the manufacturing method of flexible TFT backplane provided by the embodiment of the present invention.

Step S3: as shown in FIG. 4, repeatedly depositing a silicon nitride film (SiNx) 31 and a silicon oxide (SiOx) film 32 stacked on the silicon nitride film 31 on the flexible base substrate 2, and then using an atomic layer deposition (ALD) process to deposit an aluminum oxide ($Al_2O_3$) film 33 to form a buffer layer 3.

Specifically, in step S3, the process of depositing a silicon nitride film 31 and a silicon oxide film 32 stacked on the silicon nitride film 31 is preferably repeated 2-3 times to enhance the waterproof capability of the buffer layer 3, and the total thickness of the silicon nitride films 31 and the silicon oxide films 32 is 5000-20000 Å. Because the lowest layer of the buffer layer 3 in contact with the flexible base substrate 2 is the silicon nitride film 31, the silicon nitride film 31 provides strong adhesion and is not easily peeled off, the buffer layer 3 and the flexible base substrate 2 can be provided with the strong adhesion.

The aluminum oxide film 33 preferably has a thickness of 200-1000 Å. Because of the dense texture of the aluminum oxide film 33, the ability to cover defects is strong, the effect of blocking water and vapor is significant, and the buffer layer 3 can be provided with better resistance to water and vapor.

Figure 5:
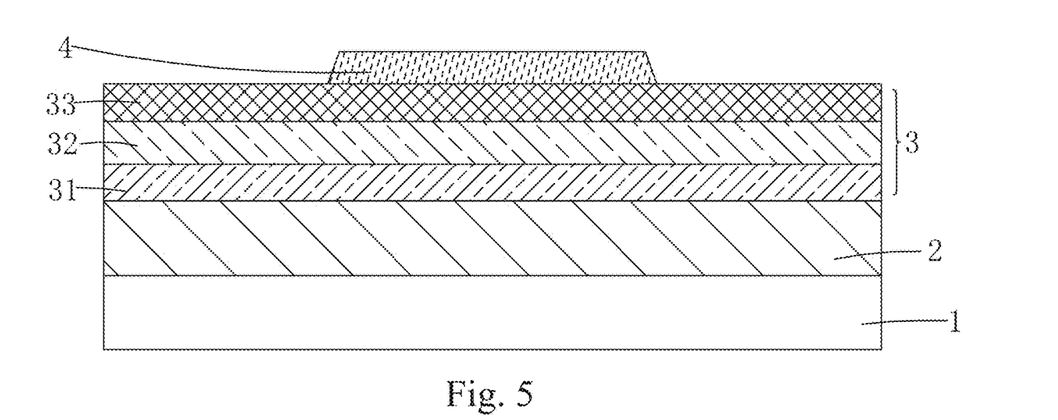
FIG. 5 is a schematic view showing step S4 of the manufacturing method of flexible TFT backplane provided by the embodiment of the present invention.

Step S4: as shown in FIG. 5, depositing a first metal film on the buffer layer 3 and patterning the first metal film to form a gate 4.

Specifically, the first metal film may be a stacked combination of one or more of the following materials: molybdenum (Mo), aluminum (Al), copper (Cu), and titanium (Ti), and has a total thickness of 2000-8000 Å.

Figure 6:
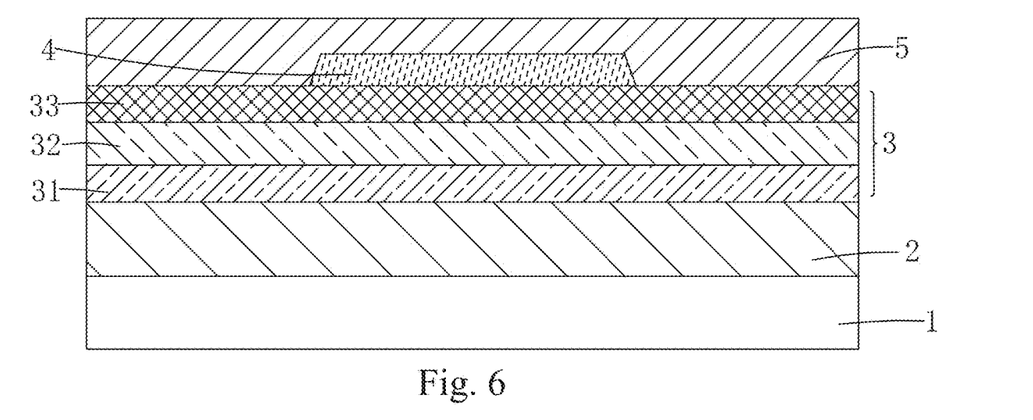
FIG. 6 is a schematic view showing step S5 of the manufacturing method of flexible TFT backplane provided by the embodiment of the present invention.

Step S5: as shown in FIG. 6, depositing a gate insulating layer 5 on the gate 4 and buffer layer 3.

Specifically, the gate insulating layer 5 is made of silicon oxide and the thickness is 1000-5000 Å.

Figure 7:
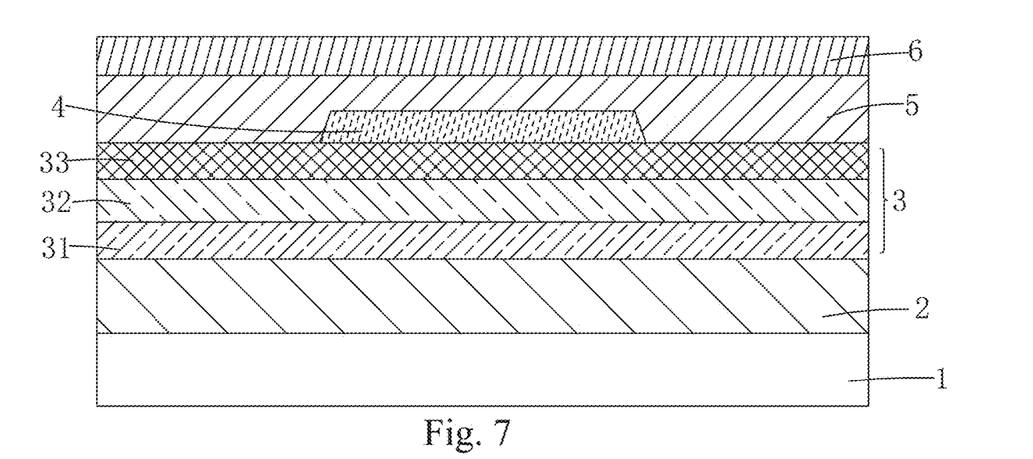
FIG. 7 is a schematic view showing step S6 of the manufacturing method of flexible TFT backplane provided by the embodiment of the present invention.

Step S6: preparing a mixed solution of carbon nanotubes (CNT) and metal oxide, then, as shown in FIG. 7, coating the mixed solution of carbon nanotubes and metal oxide on the gate insulating layer 5, and drying to obtain a film 6 of mixed carbon nanotubes and metal oxide.

Specifically, the metal oxide is preferably zinc oxide (ZnO).

When the mixed solution of carbon nanotubes and zinc oxide is prepared in step S6, the polyethylene glycol is sued as a solvent and the weight ratio of carbon nanotubes to zinc oxide is 5:100-20:100.

When the mixed solution of the carbon nanotubes and the metal oxide coated on the gate insulating layer 5 is dried, the drying temperature can be lower than 200° C., which will not damage the flexible base substrate 2. Therefore the flexible substrate 2 is not limited to any specific material.

Figure 8:
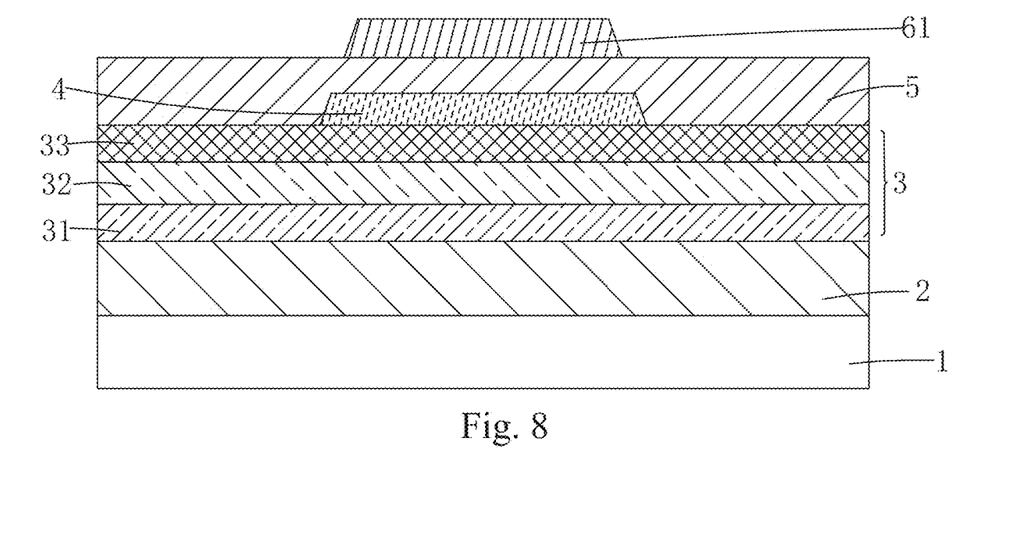
FIG. 8 is a schematic view showing step S1 of the manufacturing method of flexible TFT backplane provided by the embodiment of the present invention.

Step S7: as shown in FIG. 8, using lithography and etching process to pattern the film 6 of mixed carbon nanotubes and metal oxide to form an active layer 61 above the gate 4.

Because the carbon nanotubes are excellent in electrical conductivity, the mixture with the metal oxide to form the active layer 61 can significantly increase the electron mobility, and the carbon nanotubes provides good strength and flexibility to the active layer 61.

Step S6 and step S7 adopt the solution approach to prepare the active layer 61, which can reduce the use of the vacuum equipment and save the production cost compared to the conventional method of preparing the active layer.

Figure 9:
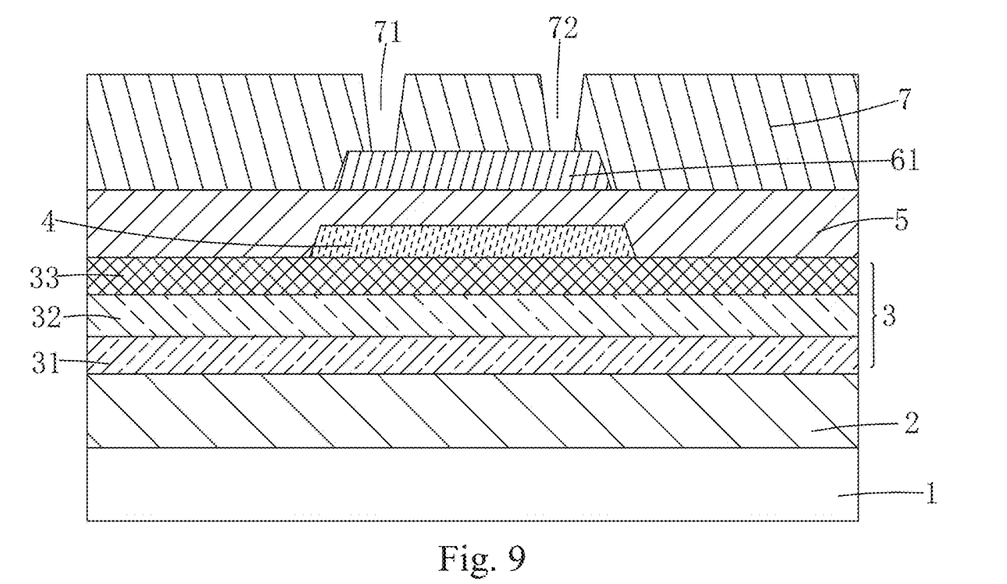
FIG. 9 is a schematic view showing step S8 of the manufacturing method of flexible TFT backplane provided by the embodiment of the present invention.

Step S8: as shown in FIG. 9, depositing an interlayer insulating layer 7 on the active layer 61 and the gate insulating layer 5, using lithography and etching process to pattern the interlayer insulating layer 7 to form a first via hole 71 and a second via hole 72 penetrating the interlayer insulating layer 7, the first via hole 71 and the second via hole 72 respectively exposing two ends of the active layer 61.

Specifically, the interlayer insulating layer 7 is made of silicon oxide and the thickness is 1000-3000 Å.

Figure 10:
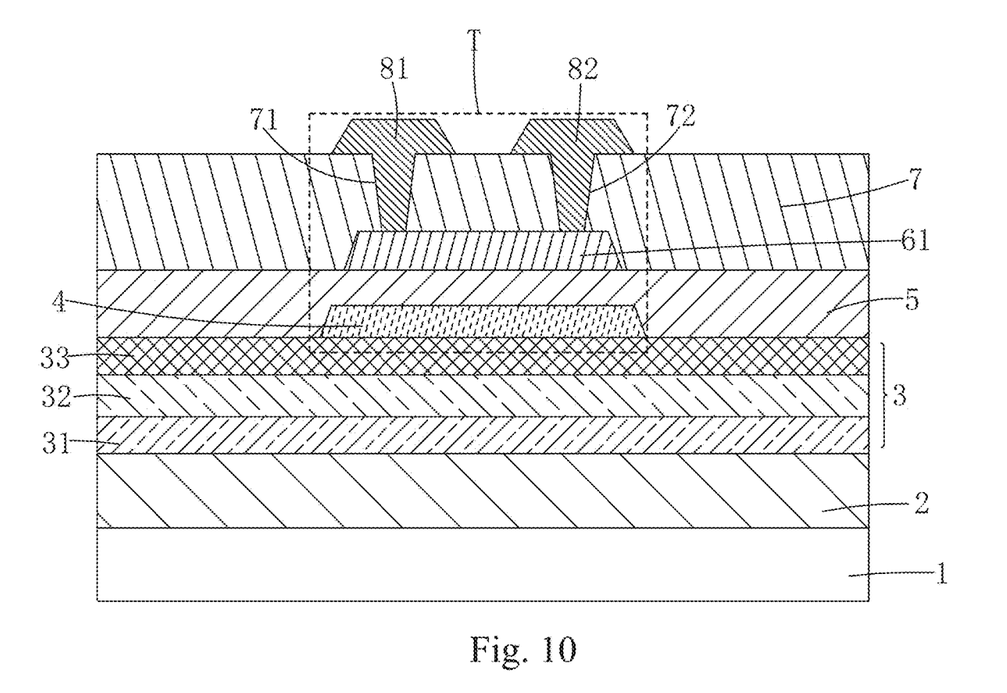
FIG. 10 is a schematic view showing step S9 of the manufacturing method of flexible TFT backplane provided by the embodiment of the present invention.

Step S9: as shown in FIG. 10, depositing a second metal film on the interlayer insulating layer, using lithography and etching process to pattern the second metal film to form a source 81 and a drain 82, the source 81 and the drain 82 contacting the two ends of the active layer 61 respectively through the first via hole 71 and the second via hole 72.

After completing step S9, the gate 4, the active layer 61, the source 81 and the drain 82 form a TFT T.

Specifically, the second metal film may be a stacked combination of one or more of the following materials: molybdenum (Mo), aluminum (Al), copper (Cu), and titanium (Ti), and has a total thickness of 2000-8000 Å.

Figure 11:
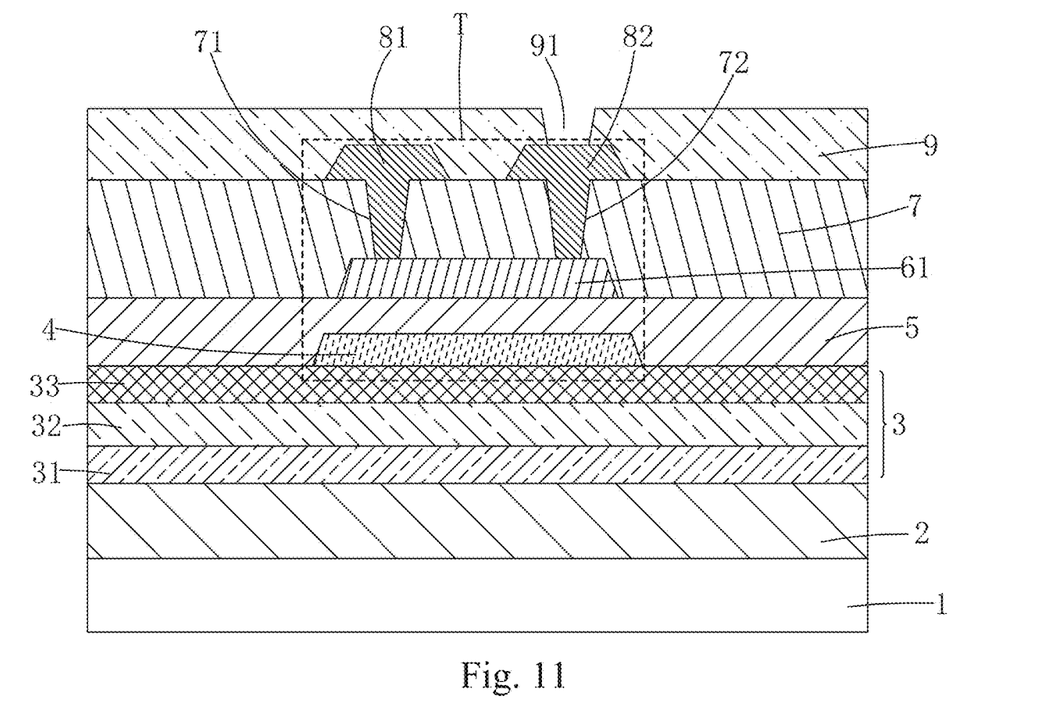
FIG. 11 is a schematic view showing step S10 of the manufacturing method of flexible TFT backplane provided by the embodiment of the present invention.

Step S10: as shown in FIG. 11, depositing a passivation layer 9 on the interlayer insulating layer 7, the source 81 and the drain 82, using lithography and etching process to pattern the passivation layer 9 to form a third via hole 91 penetrating the passivation layer 9, the third via hole 91 exposing the drain 82.

Specifically, the passivation layer 9 is made of silicon oxide or silicon nitride and the thickness is 1000-5000 Å. The third via hole 91 is for providing the OLED element to be subsequently manufactured with connection path to the drain 82.

Step S11: as shown in FIG. 1, removing the glass substrate 1.

At this point, the manufacturing method of flexible TFT backplane is complete.

the manufacturing method of flexible TFT backplane provided by the present invention uses a mixed solution of carbon nanotubes and a metal oxide to prepare the active layer 61 of a TFT, and the temperature of the manufacturing is lower and will not cause damage to the flexible base substrate 2, and hence the material of the flexible base substrate 2 is not restricted. The use of the vacuum equipment can be reduced to save production cost. The carbon nanotubes have excellent conductivity, and the mixture with the metal oxide as the active layer 61 of the TFT can significantly improve the electron mobility. In addition, buffer layer 3 made by the manufacturing method has a silicon nitride film 31 as the lowest layer in contact with the flexible base substrate 2, which can make the good adhesion between the buffer layer 3 and the flexible base substrate 2. The topmost layer of the buffer layer 3 is an aluminum oxide film 33, which enables the buffer layer 3 to have better resistance to water and vapor.

Figure 12:
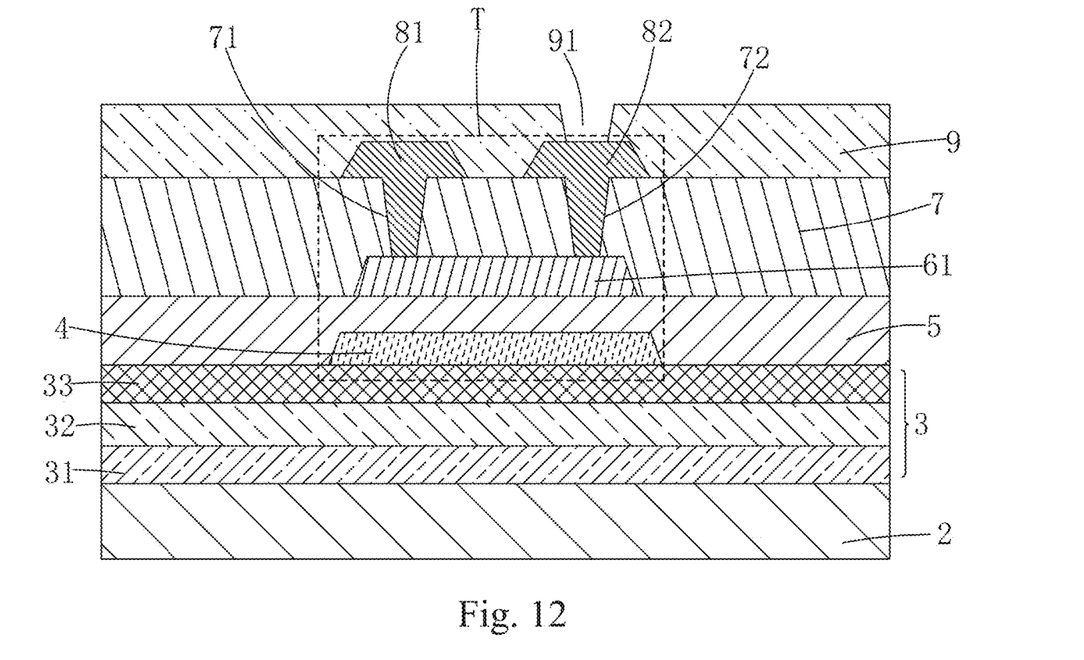
FIG. 12 is a schematic view showing step S11 of the manufacturing method of flexible TFT backplane and the flexible TFT backplane provided by the embodiment of the present invention.

Refer to FIG. 12, The present invention also provides a flexible TFT backplane manufactured by the above manufacturing method, which comprises:

a flexible base substrate 2; a buffer layer 3 covering the flexible base substrate 2, the buffer layer 3 comprising: a plurality of layers of silicon nitride films 31 and silicon oxide films 32, stacked alternatingly from the bottom to the top, with an aluminum oxide film 33 located as a top layer;

a gate 4, disposed on the buffer layer 3;

a gate insulating layer 5, covering the gate 4 and the buffer layer 3;

an active layer 61, disposed above the gate 4 and the gate insulating layer 5; the active layer 61 being made of a mixed film of carbon nanotubes and zinc oxide;

an interlayer insulating layer 7 covering the active layer 61 and the gate insulating layer 5; the interlayer insulating layer 7 being disposed with a first via hole 71 and a second via hole 72, the first via hole 71 and the second via hole 72 respectively exposing two ends of the active layer 61;

a source 81 and a drain 82, disposed on the interlayer insulating layer 7, the source 81 and the drain 82 contacting the two ends of the active layer 61 respectively through the first via hole 71 and the second via hole 72;

a passivation layer 9 covering the interlayer insulating layer 7, the source 81 and the drain 82, the passivation layer 9 being disposed with a third via hole 91, and the third via hole 91 exposing the drain 82;

the gate 4, the active layer 61, the source 81 and the drain 82 forming a TFT T.

Specifically, the flexible base substrate 2 is a yellow PI film or a transparent PI film;

in the buffer layer 3: the total thickness of the silicon nitride films 1 and the silicon oxide films 32 is 5000-20000 Å; because the lowest layer of the buffer layer 3 in contact with the flexible base substrate 2 is the silicon nitride film 31, the silicon nitride film 31 provides strong adhesion and is not easily peeled off, the buffer layer 3 and the flexible base substrate 2 can be provided with the strong adhesion; the aluminum oxide film 33 preferably has a thickness of 200-1000 Å; because of the dense texture of the aluminum oxide film 33, the ability to cover defects is strong, the effect of blocking water and vapor is significant, and the buffer layer 3 can be provided with better resistance to water and vapor;

the gate 4 may be a stacked combination of one or more of the following materials: molybdenum (Mo), aluminum (Al), copper (Cu), and titanium (Ti), and has a total thickness of 2000-8000 Å;

the gate insulating layer 5 is made of silicon oxide and the thickness is 1000-5000 Å;

the active layer 61 is preferably made of a mixed film of carbon nanotubes and metal oxide, with the weight ratio of carbon nanotubes to zinc oxide is 5-20%; because the carbon nanotubes are excellent in electrical conductivity, the mixture with the metal oxide to form the active layer 61 can significantly increase the electron mobility, and the carbon nanotubes provides good strength and flexibility to the active layer 61, which is more suitable for flexible display device;

the interlayer insulating layer 7 is made of silicon oxide and the thickness is 1000-3000 Å;

the source 81 and the drain 82 may be a stacked combination of one or more of the following materials: molybdenum (Mo), aluminum (Al), copper (Cu), and titanium (Ti), and has a total thickness of 2000-8000 Å;

the passivation layer 9 is made of silicon oxide or silicon nitride and the thickness is 1000-5000 Å.

The flexible TFT backplane provided by the present invention uses a mixed film of carbon nanotubes and metal oxides as an active layer 61 of the TFT T, which can significantly improve the electron mobility. The carbon nanotubes improve the strength and the flexibility of the active layer 61 of the TFT T and more suitable for fabricating a flexible display device. In addition, the buffer layer 3 has a silicon nitride film 31 as the lowest layer in contact with the flexible base substrate 2, which can make the good adhesion between the buffer layer 3 and the flexible base substrate 2. The topmost layer of the buffer layer 3 is an aluminum oxide film 33, which enables the buffer layer 3 to have better resistance to water and vapor.

In summary, the manufacturing method of flexible TFT backplane provided by the present invention uses a mixed solution of carbon nanotubes and a metal oxide to prepare an active layer of a TFT, and the temperature of the manufacturing is lower and will not cause damage to the flexible base substrate, and hence the material of the flexible base substrate is not restricted. The use of the vacuum equipment can be reduced to save production cost. The carbon nanotubes have excellent conductivity, and the mixture with the metal oxide as the active layer of the TFT can significantly improve the electron mobility. In addition, buffer layer made by the manufacturing method has a silicon nitride film as the lowest layer in contact with the flexible base substrate, which can make the good adhesion between the buffer layer and the flexible base substrate. The topmost layer of the buffer layer is an aluminum oxide film, which enables the buffer layer to have better resistance to water and vapor. The flexible TFT backplane provided by the present invention uses a mixed film of carbon nanotubes and metal oxides as an active layer of the TFT, which can significantly improve the electron mobility. The carbon nanotubes improve the strength and the flexibility of the active layer of the TFT and more suitable for fabricating a flexible display device. In addition, the buffer layer has a silicon nitride film as the lowest layer in contact with the flexible base substrate, which can make the good adhesion between the buffer layer and the flexible base substrate. The topmost layer of the buffer layer is an aluminum oxide film, which enables the buffer layer to have better resistance to water and vapor.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a, . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method of thin film transistor (TFT) backplane, comprising the steps of:
   Step S1: providing a glass substrate, cleaning and pre-baking the glass substrate;
   Step S2: coating a flexible base substrate on the glass substrate;
   Step S3: repeatedly depositing a silicon nitride film and a silicon oxide film stacked on the silicon nitride film on the flexible base substrate, and then depositing an aluminum oxide film to form a buffer layer;
   Step S4: depositing a first metal film on the buffer layer and patterning the first metal film to form a gate;
   Step S5: depositing a gate insulating layer on the gate and buffer layer;
   Step S6: preparing a mixed solution of carbon nanotubes and metal oxide, then coating the mixed solution of carbon nanotubes and metal oxide on the gate insulating layer, and drying to obtain a film of mixed carbon nanotubes and metal oxide;
   Step S7: patterning the film of mixed carbon nanotubes and metal oxide to form an active layer above the gate;
   Step S8: depositing an interlayer insulating layer on the active layer and the gate insulating layer, patterning the interlayer insulating layer to form a first via hole and a second via hole penetrating the interlayer insulating layer, the first via hole and the second via hole respectively exposing two ends of the active layer;
   Step S9: depositing a second metal film on the interlayer insulating layer, patterning the second metal film to form a source and a drain, the source and the drain contacting the two ends of the active layer respectively through the first via hole and the second via hole;
   the gate, the active layer, the source and the drain forming a TFT.

2. The manufacturing method of TFT backplane as claimed in claim 1, further comprising:
   Step S10: depositing a passivation layer on the interlayer insulating layer, the source and the drain, patterning the passivation layer to form a third via hole penetrating the passivation layer, the third via hole exposing the drain;
   Step S11: removing the glass substrate.

3. The manufacturing method of TFT backplane as claimed in claim 1, wherein the flexible base substrate is a yellow polyimide film or a transparent polyimide film.

4. The manufacturing method of TFT backplane as claimed in claim 1, wherein in step S3, the process of depositing a silicon nitride film and a silicon oxide film stacked on the silicon nitride film is repeated 2-3 times, and total thickness of the silicon nitride film and the silicon oxide film is 5000-20000 Å.

5. The manufacturing method of TFT backplane as claimed in claim 1, wherein in step S3, the aluminum oxide film is deposited by an atomic layer deposition process, and the aluminum oxide film has a thickness of 200-1000 Å.

6. The manufacturing method of TFT backplane as claimed in claim 1, wherein the metal oxide is zinc oxide; when the mixed solution of carbon nanotubes and zinc oxide is prepared in step S6, the weight ratio of carbon nanotubes to zinc oxide is 5:100-20:100.

7. The manufacturing method of TFT backplane as claimed in claim 6, wherein polyethylene glycol is used as a solvent when the mixed solution of carbon nanotubes and zinc oxide is prepared in step S6.

8. The manufacturing method of TFT backplane as claimed in claim 2, wherein the gate insulating layer is made of silicon oxide and the thickness is 1000-5000 Å; the interlayer insulating layer is made of silicon oxide and the thickness is 1000-3000 Å, and the passivation layer is made of silicon oxide or silicon nitride and the thickness is 1000-5000 Å;
   the first metal film and the second metal film are made of a laminated combination of one or more of molybdenum, aluminum, copper, and titanium, and the thickness is 2000-8000 Å.

9. A flexible thin film transistor (TFT) backplane, comprising:
   a flexible base substrate;
   a buffer layer covering the flexible base substrate, the buffer layer comprising: a plurality of layers of silicon nitride films and silicon oxide films, stacked alternatingly from the bottom to the top, with an aluminum oxide film located as a top layer;
   a gate, disposed on the buffer layer;
   a gate insulating layer, covering the gate and the buffer layer;
   an active layer, disposed above the gate and the gate insulating layer; the active layer being made of a mixed film of carbon nanotubes and zinc oxide;
   an interlayer insulating layer covering the active layer and the gate insulating layer; the interlayer insulating layer being disposed with a first via hole and a second via hole, the first via hole and the second via hole respectively exposing two ends of the active layer;

a source and a drain, disposed on the interlayer insulating layer, the source and the drain contacting the two ends of the active layer respectively through the first via hole and the second via hole;

the gate, the active layer, the source and the drain forming a TFT.

10. The flexible TFT backplane as claimed in claim 9, wherein the flexible TFT backplane further comprises a passivation layer covering the interlayer insulating layer, the source and the drain, the passivation layer is disposed with a third via hole; and the third via hole exposes the drain.

11. A manufacturing method of thin film transistor (TFT) backplane, comprising the steps of:

Step S1: providing a glass substrate, cleaning and pre-baking the glass substrate;

Step S2: coating a flexible base substrate on the glass substrate;

Step S3: repeatedly depositing a silicon nitride film and a silicon oxide film stacked on the silicon nitride film on the flexible base substrate, and then depositing an aluminum oxide film to form a buffer layer;

Step S4: depositing a first metal film on the buffer layer and patterning the first metal film to form a gate;

Step S5: depositing a gate insulating layer on the gate and buffer layer;

Step S6: preparing a mixed solution of carbon nanotubes and metal oxide, then coating the mixed solution of carbon nanotubes and metal oxide on the gate insulating layer, and drying to obtain a film of mixed carbon nanotubes and metal oxide;

Step S7: patterning the film of mixed carbon nanotubes and metal oxide to form an active layer above the gate;

Step S8: depositing an interlayer insulating layer on the active layer and the gate insulating layer, patterning the interlayer insulating layer to form a first via hole and a second via hole penetrating the interlayer insulating layer, the first via hole and the second via hole respectively exposing two ends of the active layer;

Step S9: depositing a second metal film on the interlayer insulating layer, patterning the second metal film to form a source and a drain, the source and the drain contacting the two ends of the active layer respectively through the first via hole and the second via hole;

the gate, the active layer, the source and the drain forming a TFT;

Step S10: depositing a passivation layer on the interlayer insulating layer, the source and the drain, patterning the passivation layer to form a third via hole penetrating the passivation layer, the third via hole exposing the drain;

Step S11: removing the glass substrate;

wherein the flexible base substrate being a yellow polyimide film or a transparent polyimide film;

wherein in step S3, the process of depositing a silicon nitride film and a silicon oxide film stacked on the silicon nitride film being repeated 2-3 times, and total thickness of the silicon nitride film and the silicon oxide film being 5000-20000 Å;

wherein in step S3, the aluminum oxide film being deposited by an atomic layer deposition process, and the aluminum oxide film having a thickness of 200-1000 Å.

12. The manufacturing method of TFT backplane as claimed in claim 11, wherein the metal oxide is zinc oxide; when the mixed solution of carbon nanotubes and zinc oxide is prepared in step S6, the weight ratio of carbon nanotubes to zinc oxide is 5:100-20:100.

13. The manufacturing method of TFT backplane as claimed in claim 12, wherein polyethylene glycol is used as a solvent when the mixed solution of carbon nanotubes and zinc oxide is prepared in step S6.

14. The manufacturing method of TFT backplane as claimed in claim 11, wherein the gate insulating layer is made of silicon oxide and the thickness is 1000-5000 Å; the interlayer insulating layer is made of silicon oxide and the thickness is 1000-3000 Å, and the passivation layer is made of silicon oxide or silicon nitride and the thickness is 1000-5000 Å;

the first metal film and the second metal film are made of a laminated combination of one or more of molybdenum, aluminum, copper, and titanium, and the thickness is 2000-8000 Å.

* * * * *